US010901029B2

(12) United States Patent
Yin et al.

(10) Patent No.: US 10,901,029 B2
(45) Date of Patent: Jan. 26, 2021

(54) CHIP AND CHIP BURNING METHOD

(71) Applicant: Huawei Technologies Co., Ltd., Shenzhen (CN)

(72) Inventors: Feifei Yin, Shanghai (CN); Yu Liu, Shanghai (CN); Jiayin Lu, Xi'an (CN); ZhuFeng Tan, Shanghai (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 235 days.

(21) Appl. No.: 15/812,640

(22) Filed: Nov. 14, 2017

(65) Prior Publication Data
US 2018/0136274 A1  May 17, 2018

(30) Foreign Application Priority Data
Nov. 15, 2016 (CN) .......................... 2016 1 1004840

(51) Int. Cl.
*G06F 3/06* (2006.01)
*G01R 31/28* (2006.01)
(Continued)

(52) U.S. Cl.
CPC ..... *G01R 31/2856* (2013.01); *G01R 31/2863* (2013.01); *G11C 7/24* (2013.01);
(Continued)

(58) Field of Classification Search
CPC .... G06F 9/526; G06F 9/52; G06F 2212/1052; G06F 3/067; G06F 3/0619;
(Continued)

(56) References Cited

U.S. PATENT DOCUMENTS

2009/0113114 A1  4/2009  Berenbaum et al.
2010/0131739 A1  5/2010  Lepine
(Continued)

FOREIGN PATENT DOCUMENTS

CN  101588643 A  11/2009
CN  101788916 A   7/2010
(Continued)

OTHER PUBLICATIONS

Machine Translation and Abstract of Chinese Publication No. CN101588643, Nov. 25, 2009, 10 pages.
(Continued)

*Primary Examiner* — Alesa Allgood
(74) *Attorney, Agent, or Firm* — Conley Rose, P.C.

(57) ABSTRACT

A chip, including a selector, a one-time programmable (OTP) device, and a controller, where the controller is separately coupled to a selection end of the selector and the OTP device, and the controller is configured to detect a device value of the OTP device, and provide a first selection signal when the device value of the OTP device is within a first preset range. A first input end of the selector is configured to receive access data, a second input end of the selector is configured to receive a preset invalid value, and an output end of the selector is coupled to the OTP device. The selector is configured to control the data received by the second input end to be output from the output end of the selector when the first selection signal is input.

20 Claims, 3 Drawing Sheets

(51) Int. Cl.
  *G11C 17/16* (2006.01)
  *G11C 17/18* (2006.01)
  *G11C 16/22* (2006.01)
  *G11C 7/24* (2006.01)
  *H01L 23/538* (2006.01)
  *H01L 23/00* (2006.01)

(52) U.S. Cl.
  CPC .............. *G11C 16/22* (2013.01); *G11C 17/16* (2013.01); *G11C 17/18* (2013.01); *H01L 23/5389* (2013.01); *H01L 24/24* (2013.01); *H01L 24/82* (2013.01)

(58) Field of Classification Search
  CPC . G06F 12/1466; G06F 9/528; H04L 67/1097; H04L 67/1095; H04L 9/3247; H04L 2463/062
  See application file for complete search history.

(56) References Cited

U.S. PATENT DOCUMENTS

| | | | | |
|---|---|---|---|---|
| 2013/0055025 | A1* | 2/2013 | Feix | G06F 21/554 714/32 |
| 2015/0100792 | A1* | 4/2015 | Hartley | G06F 21/62 713/189 |
| 2017/0300251 | A1* | 10/2017 | Kota | G06F 21/78 |

FOREIGN PATENT DOCUMENTS

| | | |
|---|---|---|
| CN | 101944011 A | 1/2011 |
| CN | 104699575 A | 6/2015 |

OTHER PUBLICATIONS

Machine Translation and Abstract of Chinese Publication No. CN101788916, Jul. 28, 2010, 13 pages.
Machine Translation and Abstract of Chinese Publication No. CN101944011, Jan. 12, 2011, 14 pages.
Machine Translation and Abstract of Chinese Publication No. CN104699575, Jun. 10, 2015, 19 pages.
Foreign Communication From a Counterpart Application, PCT Application No. PCT/CN2017/084879, International Search Report dated Jul. 26, 2017, 8 pages.
Foreign Communication From a Counterpart Application, PCT Application No. PCT/CN2017/084879, Written Opinion dated Jul. 26, 2017, 4 pages.
Foreign Communication From a Counterpart Application, European Application No. 17201736.0, Extended European Search Report dated Mar. 13, 2018, 10 pages.

* cited by examiner

CHIP AND CHIP BURNING METHOD

CROSS-REFERENCE TO RELATED APPLICATION

This application claims priority to Chinese Patent Application No. 201611004840.0 filed on Nov. 15, 2016, which is hereby incorporated by reference in its entirety.

TECHNICAL FIELD

Embodiments of the present disclosure relate to chip technologies, and in particular, to a chip and a chip burning method.

BACKGROUND

Currently, key data, test permission control information, and other information of a chip are stored basically using a one-time programmable (OTP) device such as an OTP or an eFuse. Whether a programming interface of the OTP/eFuse device is enabled is controlled using an interface value of an enable (en) pin on an exterior of the chip.

In a chip, an en pin is in an enabled state by default when the chip is sampled back. In this case, a user is allowed to directly access an OTP/eFuse device using a programming interface. After a chip test is completed, the user modifies a value of the en pin to prohibit access to the OTP/eFuse device that is performed using the programming interface.

An attacker may find the en pin exposed on an exterior and re-activate the programming interface of the OTP/eFuse device, and further obtain important information hidden in the one-time burning device such as the OTP/eFuse. Therefore, security of the chip is relatively poor.

SUMMARY

Embodiments of the present disclosure provide a chip and a chip burning method, to resolve a problem of relatively poor security of a chip.

According to a first aspect, an embodiment of the present disclosure provides a chip, including a selector, an OTP device, and a controller, where the controller is separately connected to a selection end of the selector and the OTP device, and the controller is configured to detect a device value of the OTP device, and provide a first selection signal to the selection end of the selector when the device value of the OTP device is within a first preset range, a first input end of the selector is configured to receive access data, a second input end of the selector is configured to receive a preset invalid value, and an output end of the selector is connected to the OTP device, and when the first selection signal is input to the selection end, the selector is configured to control the data received by the second input end to be output from the output end of the selector.

By means of a characteristic of the OTP device that burning is allowed only once, the controller is added, and is connected inside the chip to a selection port of the selector to control access performed using the access data to content in the OTP device in the chip. Accessing the content in the OTP device in a burning channel can be avoided after the chip is burned and verified, and there is no burning enabling port exposed on an exterior. In this way, chip security can be improved.

In a possible design, the controller is further configured to provide a second selection signal to the selection end of the selector when the device value of the OTP device is the same as a first preset value, and when the second selection signal is input to the selection end, the selector is configured to control the data received by the first input end to be output from the output end of the selector, where the first preset value is not within the first preset range.

In a possible design, the chip further includes an address filter, where an input end of the address filter is configured to receive the access data, and an output end of the address filter is connected to the first input end of the selector, and when the device value of the OTP device is the same as the first preset value, the address filter is configured to enable access data that is in the access data and whose access address is within a preset address range to be output from the output end of the address filter.

The address filter is further added, which can avoid important data in the chip from being obtained when a bare die is lost. This improves chip security.

In a possible design, the access data whose access address is within the preset address range includes an unlock instruction, and the unlock instruction is used to write the device value of the OTP device to a key value, where the key value is not within the first preset range.

A correct key value is burned such that only a user that can correctly burn the key value can implement chip burning. This avoids chip burning performed by a malicious user, and protects important information in the chip.

In a possible design, a filtering function control port of the address filter is connected to the controller. When the device value of the OTP device is the same as the key value, the controller is further configured to disable a filtering function of the address filter using the filtering function control port of the address filter, and provide the second selection signal to the selection end of the selector, and when the device value of the OTP device is the same as the key value, the address filter is further configured to enable all of the access data to be output from the output end of the address filter.

In a possible design, the access data further includes a lock instruction, and the lock instruction is used to write the device value of the OTP device to a second preset value, where the second preset value is any value within the first preset range.

In a possible design, the device value of the OTP device is data stored at a preset storage address of the OTP device.

The following describes a chip burning method provided in an embodiment of the present disclosure. The method is applied to the foregoing chip, and has corresponding technical features and technical effects, and details are not described again in this embodiment of the present disclosure.

According to a second aspect, an embodiment of the present disclosure provides a chip burning method, applied to the foregoing chip, including burning access data to the chip, where the access data includes a lock instruction, and the lock instruction is used to burn a device value of an OTP device in the chip to a second preset value, and restarting the chip, where the second preset value is any value within the first preset range.

According to a third aspect, an embodiment of the present disclosure provides a chip burning method, applied to the foregoing chip, including burning first access data to the chip, where the first access data includes an unlock instruction, an access address of the unlock instruction is within a preset address range of the address filter, and the unlock instruction is used to write a device value of the OTP device to a key value, and restarting the chip, and burning second access data to the chip, where the second access data includes a lock instruction, and the lock instruction is used to burn the device value of the OTP device in the chip to a second preset value, and restarting the chip, where the key value is not within the first preset range, and the second preset value is any value within the first preset range.

DESCRIPTION OF EMBODIMENTS

Figure 1:
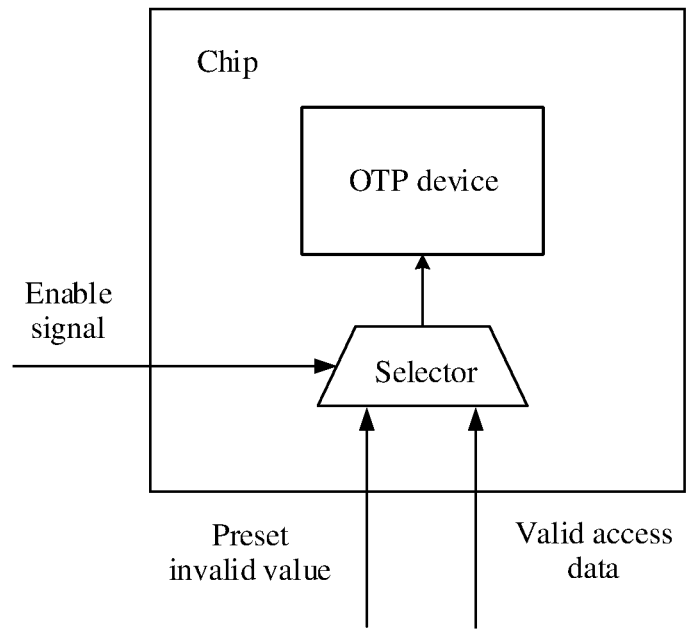
FIG. 1 is a schematic structural diagram of a chip.

FIG. 1 is a schematic structural diagram of a chip. As shown in FIG. 1, the chip includes an OTP device and an either-or type selector. Two input ends of the selector respectively receive valid access data and a preset invalid value, a selection port of the selector is connected to an exterior of the chip as a burning enabling port of the chip to receive an enable signal. After the chip is sampled back, during burning for the first time, an enable signal is provided to the burning enabling port to control the selector to output the received valid access data to the OTP device to complete burning. After burning and testing on the chip are completed, a non-enable signal is provided to the burning enabling port to control the selector to output the received preset invalid value to the OTP device to prohibit subsequent access to the OTP device.

Currently, key value, test permission control information, and other information of the chip are stored basically in the OTP device. When an attacker finds the burning enabling port exposed on the exterior of the chip, the attacker may re-activate the burning enabling port to access the OTP device to obtain important information hidden in the OTP device. Therefore, the chip has a problem of relatively poor security due to the burning enabling port exposed on the exterior. To resolve the problem, an embodiment of the present disclosure provides a chip. The chip provided in this embodiment of the present disclosure is described below in detail using a specific embodiment.

Figure 2:
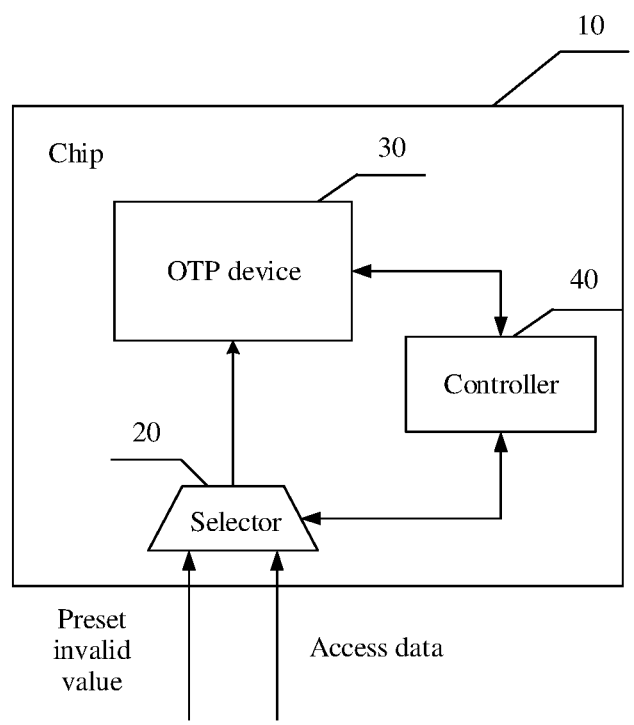
FIG. 2 is a schematic structural diagram of a chip according to Embodiment 1 of the present disclosure.

FIG. 2 is a schematic structural diagram of a chip 10 according to Embodiment 1 of the present disclosure. As shown in FIG. 2, the chip 10 includes a selector 20, an OTP device 30, and a controller 40.

The controller 40 is separately connected to a selection end of the selector 20 and the OTP device 30, and the controller 40 is configured to detect a device value of the OTP device 30, and provide a first selection signal to the selection end of the selector 20 when the device value of the OTP device 30 is within a first preset range.

A first input end of the selector 20 is configured to receive access data, a second input end of the selector 20 is configured to receive a preset invalid value, and an output end of the selector 20 is connected to the OTP device 30.

The selector 20 is configured to control the data received by the second input end to be output from the output end of the selector 20 when the first selection signal is input to the selection end.

As shown in FIG. 2, the chip 10 may include, for example, the selector 20, the OTP device 30, and the controller 40. The first input end of the selector 20 is configured to receive the access data, the second input end of the selector 20 is configured to receive the preset invalid value, and the output end of the selector 20 is connected to the OTP device 30. For example, the output end of the selector 20 is connected to a burning port of the OTP device 30. When the chip 10 is burned, and when a user burns a code program to the OTP device 30, the controller 40 controls the selector 20 to output, from the output end of the selector 20, the access data that is input from the first input end. When the chip 10 is not burned, the controller 40 controls the selector 20 to output, from the output end of the selector 20, the preset invalid value that is input from the second input end. For example, receiving the preset invalid value may include that the second input end is disabled, that is, a fixed value is provided to the second input end, and information in the OTP device 30 cannot be accessed using the fixed value.

When receiving the access data, the OTP device 30 is configured to burn, to the OTP device 30 according to the access data, program code compiled by the user such that after the burning ends, the OTP device 30 can execute the program code to complete a preset function of the program code. To avoid disposing a burning enabling port on an exterior of the chip 10, the controller 40 is added to the chip 10 in this embodiment of the present disclosure. The controller 40 is separately connected to the selection end of the selector 20 and the OTP device 30, and the controller 40 reads the device value of the OTP device 30, and inputs different selection signals to the selection end of the selector 20 according to the device value of the OTP device 30.

For example, the device value may be data stored at a preset storage address of the OTP device 30. The preset storage address may be a storage address of any length at any location in all storage addresses of the OTP device 30. A physical characteristic of the OTP device 30 is that the read device value is "0" before burning, and after the device value is burned to another value, the value cannot be modified. Therefore, the controller 40 can determine, according to the device value, whether data that is output from the output end of the selector 20 is the valid access data that is input by the user or the preset invalid value.

For example, the controller 40 is configured to detect the device value of the OTP device 30 in real time. When the device value of the OTP device 30 is within the first preset range, that is, the device value of the OTP device 30 indicates that burning on the OTP device 30 currently has been completed and no more burning is allowed, the controller 40 provides the first selection signal to the selection end of the selector 20. When an input signal received by the selection end of the selector 20 is the first selection signal, the selector 20 controls the data received by the second input end of the control selector 20 to be output from the output end of the selector 20 to provide the data for the OTP device 30. In this case, a malicious user cannot access the OTP device 30 using the access data, and cannot obtain important data stored in the OTP device 30. In addition, because the device value of the OTP device 30 cannot be modified, security of the chip 10 is ensured.

Optionally, because the physical characteristic of the OTP device 30 is that the read device value is "0" before burning, the first preset range may be, for example, another value other than 0.

According to the chip 10 provided in this embodiment of the present disclosure, by means of the characteristic of the OTP device 30 that burning is allowed only once, the controller 40 is added, and is connected inside the chip 10 to a selection port of the selector 20 to control access performed using the access data to content in the OTP device 30 in the chip 10. Accessing the content in the OTP device 30 in a burning channel can be avoided after the chip 10 is burned and verified, and there is no burning enabling port exposed on the exterior. In this way, chip 10 security can be improved.

Further, an operating principle of the controller 40 before chip burning is described based on the embodiment shown in FIG. 2.

The controller 40 is further configured to provide a second selection signal to the selection end of the selector 20 when the device value of the OTP device 30 is the same as a first preset value.

The selector 20 is configured to control the data received by the first input end to be output from the output end of the selector 20 when the second selection signal is input to the selection end.

The first preset value is not within the first preset range.

Further, when the controller 40 detects that the device value of the OTP device 30 is the same as the first preset value, the controller 40 provides the second selection signal to the selection end of the selector 20. The first preset value may be the device value "0" of the OTP device 30 before burning, and the second selection signal and the first selection signal may be, for example, 0 and 1 respectively, or may be other different values.

When a signal received by the selection end of the selector 20 is the second selection signal, the selector 20 controls the data received by the first input end to be output from the output end of the selector 20, that is, the valid access data is transmitted to the OTP device 30 to implement a burning process of the OTP device 30.

The first preset value is not within the first preset range.

Optionally, based on any embodiment above, the access data further includes a lock instruction, the lock instruction is used to write the device value of the OTP device 30 to a second preset value, and the second preset value is any value within the first preset range.

For example, during actual use, when the chip 10 is just sampled back, the controller 40 in the chip 10 detects that the device value of the OTP device 30 is "0", that is, the same as the first preset value, the controller 40 provides the second selection signal to the selection end of the selector 20 such that the access data received by the first input end is output from the output end of the selector 20 to the OTP device 30 to implement chip burning. During chip burning, the access data further includes the lock instruction, the lock instruction is used to write the device value of the OTP device 30 to the second preset value, and the second preset value is any value within the first preset range, for example, any other value different from the first preset value. For example, the device value of the OTP device 30 may be burned to "1" such that the controller 40 can determine, by detecting the device value, that the OTP device 30 has been burned, and the chip 10 is restarted after the burning is completed. In this case, the device value of the OTP device 30 that is detected by the controller 40 is, for example, "1", and is within the first preset range. Therefore, the controller 40 provides the first selection signal to the selection end of the selector 20 such that the preset invalid value received by the second input end is output from the output end of the selector 20 to the OTP device 30. This avoids access by a malicious attacker to the OTP device 30, protects the important data in the chip 10, and improves the chip 10 security.

If the chip 10 is lost before chip burning, the controller 40 controls the selector 20 to send the received access data to the OTP device 30, that is, the malicious user can access the OTP device 30 in the chip 10 to obtain possible key information stored in the OTP device 30 of the chip 10. In consideration of this, based on the embodiment shown in FIG. 2, the chip 10 further includes an address filter 50 to further improve the chip 10 security, as shown in FIG. 3.

Figure 3:
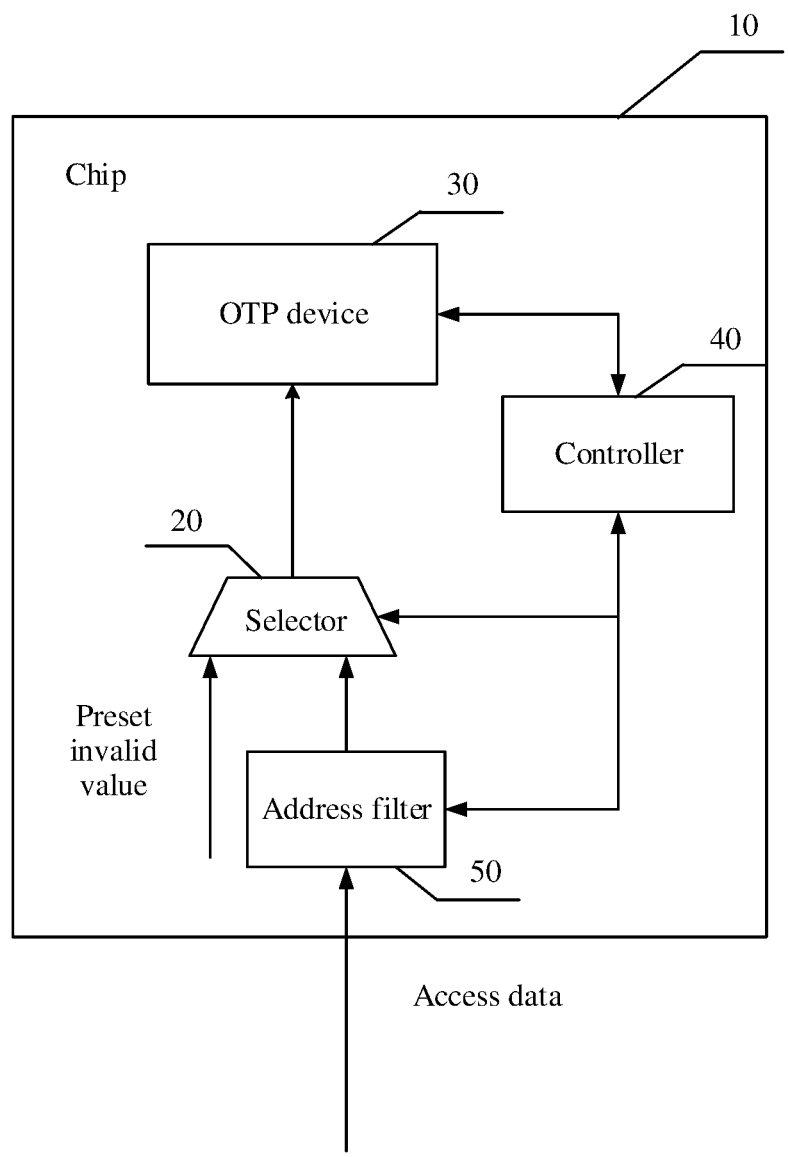
FIG. 3 is a schematic structural diagram of a chip according to Embodiment 2 of the present disclosure.

FIG. 3 is a schematic structural diagram of a chip according to Embodiment 2 of the present disclosure.

An input end of the address filter 50 is configured to receive the access data, and an output end of the address filter 50 is connected to the first input end of the selector 20.

When the device value of the OTP device 30 is the same as the first preset value, the address filter 50 is configured to enable access data that is in the access data and whose access address is within a preset address range to be output from the output end of the address filter 50.

The address filter 50 is added to the chip 10, and is disposed between an external access data input port and the first input end of the selector 20 to filter access data that is input to the selector 20. A filtering function of the address filter 50 is enabled by default, to control only the access data whose access address is within the preset address range to be input to the selector 20 using the address filter 50.

When the chip 10 is just sampled back, that is, the chip 10 is a bare die, the controller 40 detects that the device value of the OTP device 30 is the same as the first preset value. In this case, the address filter 50 has an address filtering function such that the access data that is in the access data and whose access address is within the preset address range is output from the output end of the address filter 50 to the input end of the selector 20, and then output from the output end of the selector 20 to the OTP device 30. That is, when a malicious user steals the bare die, and inputs access data to the chip using the external access data port, due to the filtering function of the address filter 50, the malicious user can be prevented from burning address space storing important data, and therefore the chip 10 is protected.

According to the chip 10 provided in this embodiment of the present disclosure, the address filter 50 is further added. This can avoid the important data in the chip 10 from being obtained when the bare die is lost, and can further improve the chip 10 security.

Further, based on the embodiment shown in FIG. 3, the access data whose access address is within the preset address range includes an unlock instruction, and the unlock instruction is used to write the device value of the OTP device 30 to a key value.

The key value is not within the first preset range.

Further, to burn the OTP device 30, the access data includes the unlock instruction, an access address of the unlock instruction is within the preset address range of the address filter 50, and an access instruction is used to write the device value of the OTP device to the key value.

When the user intends to burn the chip 10, the user may input the unlock instruction. Because the access address of the unlock instruction is within the preset address range, burning can be implemented. After the burning, the device value is the key value, the key value is different from the first preset value, and after the address filter 50 is added, the first preset range does not include the key value.

Further, based on any embodiment above, a filtering function control port of the address filter 50 is connected to the controller 40.

When the device value of the OTP device 30 is the same as the key value, the controller 40 is further configured to disable the filtering function of the address filter 50 using the filtering function control port of the address filter 50, and provide the second selection signal to the selection end of the selector 20.

When the device value of the OTP device 30 is the same as the key value, the address filter 50 is further configured to enable all of the access data to be output from the output end of the address filter 50.

The filtering function control port of the address filter 50 is connected to the controller 40, and the controller 40 can control the filtering function of the address filter 50 to be enabled or disabled. When the filtering function is disabled, any access data can be input to the selector 20 using the address filter 50.

During specific implementation, when the controller 40 detects that the device value of the OTP device 30 is the same as the key value, the controller 40 disables the filtering function of the address filter 50 using the filtering function control port of the address filter 50, and provides the second selection signal to the selection end of the selector 20. Therefore, any access can be input to the OTP device 30 using the address filter 50 and the selector 20 to implement burning.

Therefore, only a user that can correctly burn the key value can implement chip burning, chip burning by a malicious user is avoided, and the important information in the chip 10 is protected.

The access data further includes a lock instruction, and the lock instruction is used to write the device value of the OTP device 30, that is, the key value to a second preset value. The second preset value is any value within the first preset range, for example, any other value different from the first preset value and the key value.

Figure 4:
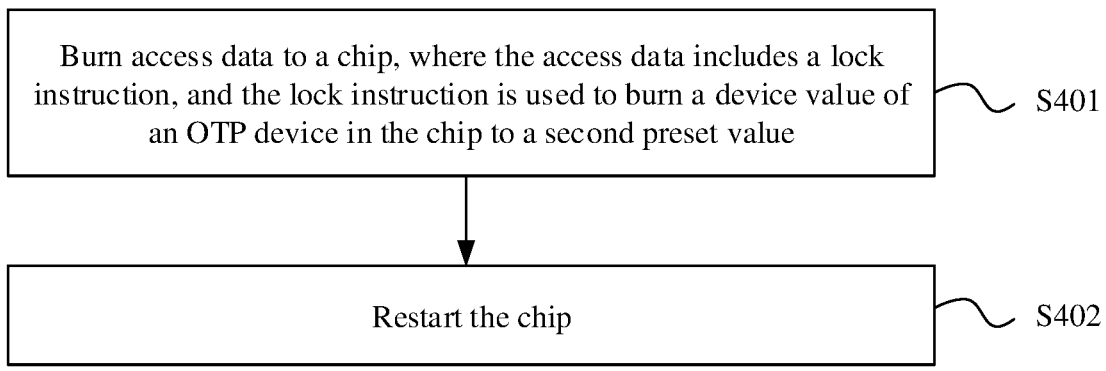
FIG. 4 is a schematic flowchart of a chip burning method according to Embodiment 1 of the present disclosure.

Another aspect of the embodiments of the present disclosure requests to protect a chip burning method. The method is applied to the chip 10 shown in FIG. 2. FIG. 4 is a schematic flowchart of a chip burning method according to Embodiment 1 of the present disclosure. As shown in FIG. 4, the method includes the following steps.

Step S401: Burn access data to the chip, where the access data includes a lock instruction, and the lock instruction is used to burn a device value of an OTP device in the chip to a second preset value.

Step S402: Restart the chip.

The second preset value is any value within a first preset range.

When a user obtains a sampled-back chip, the user starts the chip. In this case, a device value of an OTP device that is read by a controller is a first preset value, and in this case, the controller controls access data to be directly output to the OTP device such that the chip can be burned. Therefore, step S401 is performed to burn the access data to the chip. The access data includes a software program designed by the user, and further includes a lock instruction. The lock instruction is used to burn the device value of the OTP device to a second preset value, that is, the original first preset value indicating that chip burning is allowed is modified to the different second preset value. After burning is completed, step S402 is performed to restart the chip.

After the chip is restarted, the device value of the one-time burning device that is read by the controller is the second preset value. The second preset value is different from the first preset value, and is within a first preset range. In this case, even if a malicious user inputs access data to the chip using an access data interface, the OTP device still cannot be accessed. In this way, important information in the chip is protected.

Figure 5:
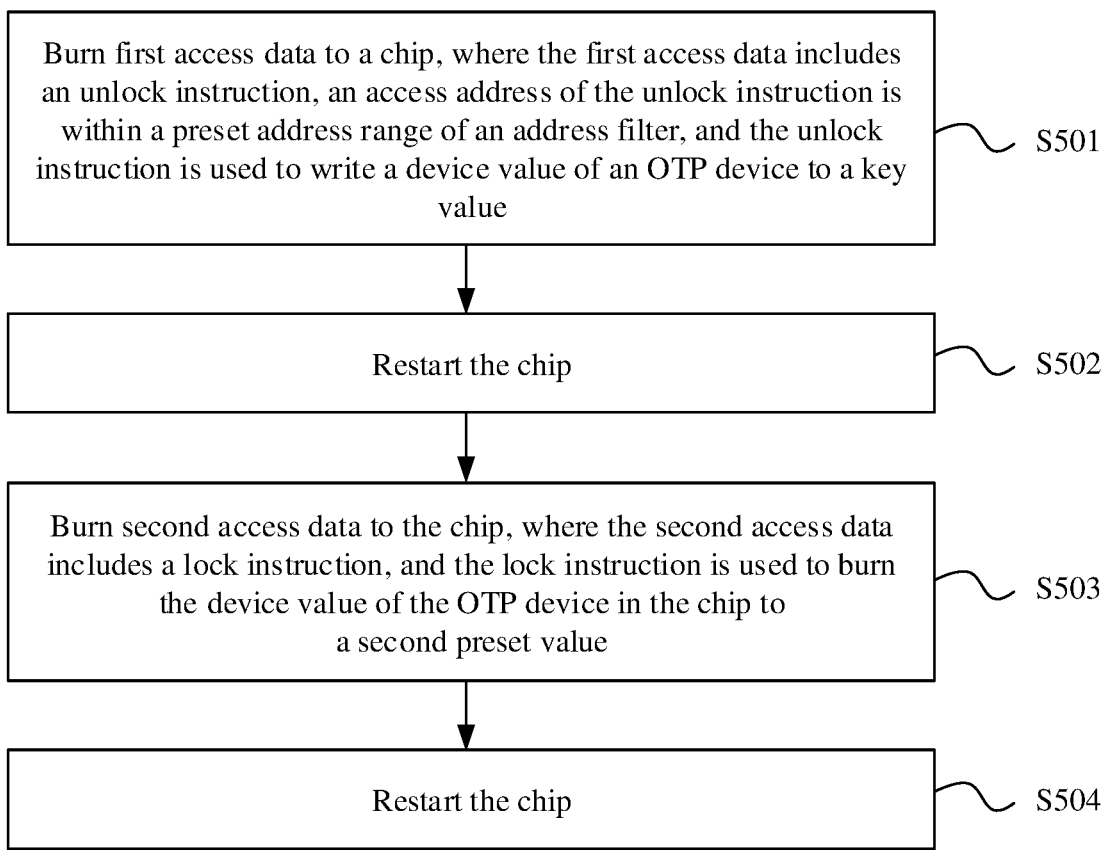
FIG. 5 is a schematic flowchart of a chip burning method according to Embodiment 2 of the present disclosure.

Still another aspect of the embodiments of the present disclosure further requests to protect a chip burning method. The method is applied to the chip 10 shown in FIG. 3. FIG. 5 is a schematic flowchart of a chip burning method according to Embodiment 2 of the present disclosure. As shown in FIG. 5, the method includes the following steps.

Step S501: Burn first access data to the chip, where the first access data includes an unlock instruction, an access address of the unlock instruction is within a preset address range of an address filter, and the unlock instruction is used to write a device value of an OTP device to a key value.

Step S502: Restart the chip.

Step S503: Burn second access data to the chip, where the second access data includes a lock instruction, and the lock instruction is used to burn the device value of the OTP device in the chip to a second preset value.

Step S504: Restart the chip.

The key value is not within a first preset range, and the second preset value is any value within the first preset range.

Further, when a user obtains a sampled-back chip, the user starts the chip. In this case, a device value of an OTP device that is read by a controller is a first preset value, and an address filter filters access addresses in access data. Therefore, only a part of data in the OTP device can be accessed, a software program compiled by the user cannot be burned, and important data in the chip can be protected.

To burn the chip, step S501 is first performed to burn first access data. The first access data includes an unlock instruction, an access address of the unlock instruction is within a preset address range of the address filter, and the unlock instruction is used to write the device value of the OTP device to a key value. Then, step S502 is performed to restart the chip. The first preset value is burned to the key value such that the controller can detect that the device value of the OTP device is the key value, and in this case, the controller controls the address filter to stop address filtering, and controls a selector to send the received access data to the OTP device to enable a chip burning function. That is, only a user having the key value for burning can start a chip burning procedure.

After the key value is burned to the chip, step S503 is performed to burn second access data to the chip. The second access data includes software code of the user, and further includes a lock instruction. The lock instruction is used to burn the device value, that is, the key value, of the OTP device in the chip to a second preset value. After burning is completed, step S504 is performed to restart the chip. The chip burning process is completed by performing step S503, and the device value of the chip is burned to the second preset value such that the device value detected by the controller is different from the first preset value and the key value. This prevents access performed using access data to the OTP device, and protects the chip.

Persons of ordinary skill in the art may understand that all or some of the steps of the method embodiments may be implemented by a program instructing relevant hardware. The program may be stored in a computer-readable storage medium. When the program runs, the steps of the method embodiments are performed. The foregoing storage medium includes any medium that can store program code, such as a read-only memory (ROM), a random access memory (RAM), a magnetic disk, or an optical disc.

Finally, it should be noted that the foregoing embodiments are merely intended for describing the technical solutions of the present disclosure, but not for limiting the present disclosure. Although the present disclosure is described in detail with reference to the foregoing embodiments, persons of ordinary skill in the art should understand that they may still make modifications to the technical solutions described in the foregoing embodiments or make equivalent replacements to some or all technical features thereof, without departing from the scope of the technical solutions of the embodiments of the present disclosure.

What is claimed is:

1. A chip, comprising:
    a selection circuit comprising:
        a first input end configured to receive access data; and
        a second input end configured to receive a preset invalid value;
    a one-time programmable (OTP) device coupled to an output end of the selection circuit and configured to:
        store access data;
        determine a device value indicating whether access to content in the OTP device is permitted, wherein the device value is stored at the OTP device; and
        write the device value to a preset value within a preset range after the access data has been stored at the OTP device, wherein the device value is immutable after the device value is written to the preset value within the preset range, and wherein when the device value is written to the preset value within the preset range, the device value indicates that burning on the OTP device has been completed and additional burning to the OTP device is prohibited;
    a control circuit coupled to a selection end of the selection circuit and the OTP device, wherein the control circuit is configured to:
        detect the device value of the OTP device; and
        provide a first selection signal to the selection end of the selection circuit when the device value of the OTP device is within the preset range, wherein the first selection signal instructs the selection circuit to output the preset invalid value to the OTP device.

2. The chip according to claim 1, wherein the access data comprises a lock instruction, and wherein the lock instruction comprises an instruction to write the device value of the OTP device to the preset value within the preset range.

3. The chip according to claim 1, wherein the device value of the OTP device comprises data stored at a preset storage address of the OTP device.

4. The chip according to claim 1, wherein the control circuit is further configured to provide a second selection signal to the selection end of the selection circuit when the device value of the OTP device is the same as a first preset value, wherein the selection circuit is further configured to output the access data received by the first input end to the OTP device when the second selection signal is input to the selection end, and wherein the first preset value is not within the preset range.

5. The chip according to claim 4, further comprising an address filter, wherein an input end of the address filter is configured to receive the access data, wherein an output end of the address filter is coupled to the first input end of the selection circuit, and wherein the address filter is configured to enable access data in the access data having an access address within a preset address range to be output from the output end of the address filter to the selection circuit.

6. The chip according to claim 5, wherein, before the device value is written to the preset value within the preset range, the access data having the access address within the preset address range comprises an unlock instruction instructing the OTP device to write the device value of the OTP device to a key value, and wherein the key value is not within the preset range.

7. The chip according to claim 6, wherein a filtering function control port of the address filter is coupled to the control circuit, and wherein when the device value of the OTP device is the same as the key value, the address filter is further configured to enable all of the access data to be output from the output end of the address filter to the selection circuit and the control circuit is further configured to:
    disable a filtering function of the address filter using the filtering function control port of the address filter; and
    provide the second selection signal to the selection end of the selection circuit.

8. A chip burning method applied to a chip, comprising:
    burning, by E one-time programmable (OTP) device of the chip, access data to the chip, wherein the access data comprises a lock instruction instructing the OTP device to write a device value of the OTP device in the chip to a preset value within a preset range, and wherein the device value indicates whether access to content in the OTP device is permitted;
    writing, by the OTP device, the device value of the OTP device to the preset value after burning the access data to the chip, wherein the device value is immutable after the device value is written to the preset value within the preset range, and wherein when the device value is written to the preset value, the device value indicates that burning on the OTP device has been completed and additional burning to the OTP device is prohibited;
    restarting the chip after writing the device value of the OTP device to the preset value;
    detecting, by a control circuit of the chip, the device value of the OTP device after restarting the chip;
    providing, by the control circuit to a selection circuit of the chip, a first selection signal to the selection circuit when the device value of the OTP device is within the preset range, wherein the first selection signal instructs the selection circuit to output a preset invalid value to the OTP device; and
    outputting, by the selection circuit, the preset invalid value to the OTP device based on the first selection signal.

9. The chip burning method according to claim 8, further comprising providing, by the control circuit to the selection circuit, a second selection signal to the selection circuit when the device value of the OTP device is the same as a first preset value, wherein the second selection signal instructs the selection circuit to output access data to the OTP device.

10. The chip burning method according to claim 9, further comprising filtering, by an address filter of the chip, the access data to obtain access data having an access address within a preset address range.

11. The chip burning method according to claim 10, further comprising outputting, by the address filter, the access data having the access address within the preset address range to the selection circuit.

12. The chip burning method according to claim 11, wherein the access data having the access address within the preset address range comprises an unlock instruction instructing the OTP device to write the device value of the OTP device to a key value, and wherein the key value is not within the preset range.

13. The chip burning method according to claim 11, further comprising outputting, by the address filter, all of the access data to the selection circuit when the device value of the OTP device is the same as a key value, wherein the key value indicates that access to content in the OTP device is permitted.

14. A chip burning method applied to a chip, comprising:
    burning, by a one-time programmable (OTP) device of the chip, first access data to the chip, wherein the first access data comprises an unlock instruction, wherein an access address of the unlock instruction is within a preset address range of an address filter, wherein the unlock instruction instructs the OTP device to write a device value of the OTP device to a key value, and wherein the device value of the OTP device indicates whether access to content in the OTP device is permitted;

writing, by the OTP device, the device value of the OTP device to the key value after burning the first access data to the chip;

restarting the chip after writing the device value of the OTP device to be the key value;

burning second access data to the chip after restarting chip, wherein the second access data comprises a lock instruction instructing the OTP device to write the device value of the OTP device in the chip to a preset value within a preset range;

writing, by the OTP device, the device value of the OTP device to the preset value after burning the second access data to the chip, wherein the device value is immutable after the device value is written to the preset value within the preset range, and wherein when the device value is written to the preset value, the device value indicates that burning on the OTP device has been completed and additional burning to the OTP device is prohibited;

detecting, by a control circuit of the chip, the device value of the OTP device;

providing, by the control circuit to a selection circuit of the chip, a first selection signal to the selection circuit when the device value of the OTP device is within the preset range, wherein the first selection signal instructs the selection circuit to output a preset invalid value to the OTP device; and outputting, by the selection circuit, the preset invalid value to the OTP device based on the first selection signal.

15. The chip burning method according to claim 14, wherein the key value is not within the preset range.

16. The chip burning method according to claim 14, wherein the device value of the OTP device comprises data stored at a preset storage address of the OTP device.

17. The chip burning method according to claim 14, further comprising providing, by the control circuit to the selection circuit, a second selection signal to the selection circuit when the device value of the OTP device is not within the preset range, wherein the second selection signal instructs the selection circuit to output access data to the OTP device.

18. The chip burning method according to claim 17, further comprising filtering, by an address filter of the chip, the access data to obtain access data having an access address within a preset address range.

19. The chip burning method according to claim 18, further comprising outputting, by the address filter, the access data having the access address within the preset address range to the selection circuit.

20. The chip burning method according to claim 18, further comprising outputting, by the address filter, all of the access data to the selection circuit when the device value of the OTP device is the same as the key value, wherein the key value indicates that access to content in the OTP device is permitted.

* * * * *